United States Patent
Tsakalakos et al.

(10) Patent No.: US 8,933,526 B2
(45) Date of Patent: Jan. 13, 2015

(54) NANOSTRUCTURED FUNCTIONAL COATINGS AND DEVICES

(75) Inventors: Loucas Tsakalakos, Niskayuna, NY (US); Eric Gardner Butterfield, Watervliet, NY (US); Alok Mani Srivastava, Niskayuna, NY (US); Bastiaan Arie Korevaar, Schenectady, NY (US)

(73) Assignee: First Solar, Inc., Tempe, AZ (US)

( * ) Notice: Subject to any disclaimer, the term of this patent is extended or adjusted under 35 U.S.C. 154(b) by 1116 days.

(21) Appl. No.: 12/503,390

(22) Filed: Jul. 15, 2009

(65) Prior Publication Data

US 2011/0012086 A1  Jan. 20, 2011

(51) Int. Cl.
| | |
|---|---|
| H01L 31/0216 | (2014.01) |
| H01L 31/042 | (2014.01) |
| H01L 31/055 | (2014.01) |
| G02B 1/11 | (2006.01) |
| H01L 31/0236 | (2006.01) |

(52) U.S. Cl.
CPC .......... G02B 1/118 (2013.01); H01L 31/02168 (2013.01); Y02E 10/52 (2013.01); H01L 31/055 (2013.01); H01L 31/0236 (2013.01)
USPC ............. 257/437; 257/E31.119; 257/E31.13

(58) Field of Classification Search
CPC ............ H01L 31/0216; H01L 31/02167; H01L 31/02168; H01L 31/0236; H01L 31/055; G02B 1/118
USPC ................ 257/9–39, 437, E31.119, E31.13
See application file for complete search history.

(56) References Cited

U.S. PATENT DOCUMENTS

| | | | |
|---|---|---|---|
| 4,278,474 A | 7/1981 | Blakeslee et al. | |
| 5,828,118 A | 10/1998 | Russell | |
| 7,196,835 B2 * | 3/2007 | Peumans et al. | 359/245 |
| 7,374,807 B2 | 5/2008 | Parce et al. | |
| 7,442,320 B2 | 10/2008 | Lee | |
| 2006/0068154 A1 * | 3/2006 | Parce et al. | 428/76 |
| 2008/0051235 A1 | 2/2008 | Tada et al. | |
| 2008/0066797 A1 | 3/2008 | Tavkhelidze et al. | |
| 2008/0087326 A1 | 4/2008 | Scholes et al. | |
| 2008/0110489 A1 | 5/2008 | Sepehry-Fard | |
| 2009/0050204 A1 * | 2/2009 | Habib | 136/261 |
| 2009/0084963 A1 | 4/2009 | Kost | |
| 2009/0188557 A1 * | 7/2009 | Wang et al. | 136/256 |

(Continued)

FOREIGN PATENT DOCUMENTS

| | | |
|---|---|---|
| EP | 1862827 A1 | 12/2007 |
| EP | 2110862 A1 | 10/2009 |

(Continued)

OTHER PUBLICATIONS

Q. Y. Zhang, C. H. Yang; Cooperative quantum cutting in one-dimensional YbxGd1-x . . . Al3,,BO3 . . . 4Tb3+nanorods; Applied Physics Letters 90, 021107 ,2007.

(Continued)

*Primary Examiner* — Allison P Bernstein
(74) *Attorney, Agent, or Firm* — MacMillan, Sobanski & Todd, LLC

(57) ABSTRACT

An article including a nanostructured functional coating disposed on a substrate is described. The functional coating is characterized by both anti-reflection properties and down-converting properties. Related optoelectronic devices are also described.

26 Claims, 3 Drawing Sheets

(56) References Cited

U.S. PATENT DOCUMENTS

| | | | |
|---|---|---|---|
| 2009/0194160 A1* | 8/2009 | Chin et al. ............... | 136/256 |
| 2010/0326522 A1 | 12/2010 | Okaniwa | |

FOREIGN PATENT DOCUMENTS

| | | |
|---|---|---|
| JP | 2005101513 A | 4/2005 |
| WO | 03079457 A1 | 9/2003 |
| WO | 2008051235 A2 | 5/2008 |
| WO | 2008060829 A2 | 5/2008 |
| WO | 2008096711 A1 | 8/2008 |

OTHER PUBLICATIONS

A Reyes-Coronado, A Garc'a-Valenzuela, C Sánchez-P'erez, R G Barrera; Measurement of the effective refractive index of a turbid colloidal suspension using light refraction; New Journal of Physics 7 (2005) 89; Published Apr. 6, 2005; pp. 1-22.

J.-Q. Xi, Martin F. Schubert, Jong Kyu Kim, E. Fred Schubert, Minfeng Chen, Shawn-Yu Lin, W. Liu, J. A. Smart; Optical thin-film materials with low refractive index for broadband elimination of Fresnel reflection; nature photonics, vol. 1, Published online: Mar. 1, 2007; pp. 176-179.

Loucas Tsakalakos, Joleyn Balch, Jody Fronheiser, Min-Yi Shih, Steven F. Leboeuf, Mathew Pietrzykowski, Peter J. Codella, Bas A. Korevaar, Oleg Sulima, Jim Rand, Anilkumar Davuluru, Umakant Rapol; Strong broadband optical absorption in silicon nanowire films; Journal of Nanophotonics, vol. 1, 013552 (Jul. 17, 2007); pp. 1-10.

B S Lukyanchuk, M I Tribelsky, V Ternovsky, Zbwang, Mhhong, L P Shi and T C Chong; Peculiarities of light scattering by nanoparticles and nanowires near plasmon resonance frequencies in weakly dissipating materials; Journal of Optics A: Pure and Applied Optics, 9 (2007) S294-S300.

Y.P. Zhao, D.X. Ye, G.C. Wang, T.M. Lu; Designing Nanostructures by Glancing Angle Deposition; Proceedings of SIPE vol. 5219 Nanotubes and Nanowires; SPIE, Bellingham, WA, 2003.

R.S Wagner, W.C. Ellis; Vapor-liquid-solid mechanism of single crystal growth; Appl. Phys. Lett. 4(5), 89-90 (1964).

J. Fronheiser, J. Balch, L. Tsakalakos; Conformal dielectric films on silicon nanowire arrays by plasma enhanced chemical vapor deposition; Journal of Nanoparticle Research, 10 955 (2008). ; 9 Pages.

John C. Hulteen, Richard P. Van Duyne; Nanosphere lithography: A materials general fabrication process for periodic particle array surfaces; J. Vac. Sci. Technol. A, 13 1553 (1995); pp. 1553-1558.

Yangang Andrew Xi, Loucas Tsakalakos, Bastiaan Arie Korevaar, Todd Ryan Tolliver, Dalong Zhong; Title : Nanostructured Anti-Reflection Coatings and Associated Methods and Devices; U.S. Appl. No. 12/421,101, filed Apr. 9, 2009.

Search Report and Written Opinion from corresponding EP Application No. 10169402.4-1234 dated Oct. 25, 2010.

Matsui et al., "Room temperature replication in spin on glass by nanoimprint technology", J. Vac. Sci. Technol. B 19 (6), pp. 2801-2805, Nov./Dec. 2001.

Kikuta et al., "Optical Elements with Subwavelength Structured Surfaces" Optical Review, Springer, Berlin, DE, vol. 10, No. 2, pp. 63-73, Mar. 1, 2003.

Svrcek et al., "Silicon nanocrystals as light converter for solar cells" Thin Solid Films, Elsevier-Sequoia S.A. Lausanne, CH, vol. 451-452, pp. 384-388, Mar. 22, 2004.

Australian Patent Examination Report No. 1, Application No. 2010202874, dated Jul. 21, 2014.

Svrcek et al., "Silicon nanocrystals as light converter for solar cells," Thin Solid Films, 2004, vol. 451-452, pp. 384-388.

Chinese Office Action Application No. CN 201010236517.2, dated Dec. 5, 2013.

European Office Action, Application No. 10169402.4, dated Jun. 6, 2014.

Second Chinese Office Action, Application No. 201010236517.2, dated Jul. 21, 2014.

\* cited by examiner

NANOSTRUCTURED FUNCTIONAL COATINGS AND DEVICES

BACKGROUND

This invention generally relates to a coating for optical surfaces, to improve energy conversion. More particularly, the invention relates to a coating for improving energy conversion in optoelectronic devices. The invention also relates to optoelectronic devices using such coatings.

One of the main focuses in the field of optoelectronic devices is the improvement of energy conversion efficiency (from electromagnetic energy to electric energy or vice versa). The devices often suffer reduced performance due to loss of light. Therefore, research in optical designs of these devices includes light collection and trapping, spectrally matched absorption and up/down light energy conversion.

A potential method of light collection is the reduction of light reflection by having a reflection-free surface. To this end, anti-reflection coatings of suitable refractive indices are commonly used. However, the availability of such materials having a low refractive index, e.g., between 1.0 (air) and 1.49 (glass), is very limited.

It is seen from current research that nanostructured optical thin films with controllable porosity often exhibit a very low refractive index as compared to dense materials. For example, $SiO_2$ nanostructured porous films often have a refractive index of about 1.08, which is much lower than the value of 1.46 for an $SiO_2$ thin film. These single layer anti-reflection coatings reduce reflectivity only in a limited spectral range, and for normal incidence.

Furthermore, the devices suffer loss of efficiency due to a thermalization mechanism in which carriers generated by high-energy photons are lost as phonons in the crystal. The absorption of incident photons with energies greater than the threshold energy for the absorption leads to the generation of only one electron-hole pair per absorbed photon, regardless of the photon energy. The excess energy of an incident photon above the threshold energy is wasted during the thermalization of the generated electron-hole pairs. Certain cell designs, employing a heterojunction window layer, lose high-energy photons due to parasitic absorption in the window layer. It is therefore desirable to convert these high-energy photons (short wavelength) to lower energy photons (long wavelength) that can be effectively absorbed in an absorber layer, and converted to collectable charge carriers.

One well-known method to overcome loss of light and related loss mechanisms involves "down-conversion" of high electromagnetic energy from a shorter wavelength to a longer wavelength. Because the absorption of high-energy photons in an undesired regions/layers of optoelectronic devices must be avoided, a down-converting layer may be disposed on a surface of the device, exposed to electromagnetic radiation.

Usually, deposition of anti-reflection and down-converting layers includes multiple processing steps. Thus, it would be desirable to produce improved coating systems having both anti-reflecting and down-converting properties, in order to meet various performance requirements for optoelectronic devices. Moreover, the new coating system can provide the advantage of easy fabrication. It would also be very desirable to develop an improved optoelectronic device including such coating.

BRIEF DESCRIPTION OF THE INVENTION

Embodiments of the invention provide an article including a nanostructured functional coating disposed on a substrate. The functional coating is characterized by both anti-reflection properties and down-converting properties.

According to some embodiments of the invention, an optoelectronic device is provided. The device includes a substrate, a multi-layer structure disposed on the substrate and a nanostructured function coating disposed on an electromagnetic radiation-receiving surface of the device. The functional coating is characterized by both the anti-reflection properties and down-converting properties.

DRAWINGS

These and other features, aspects, and advantages of the present invention will become better understood when the following detailed description is read with reference to the accompanying drawings, wherein.

DETAILED DESCRIPTION

Figure 1:
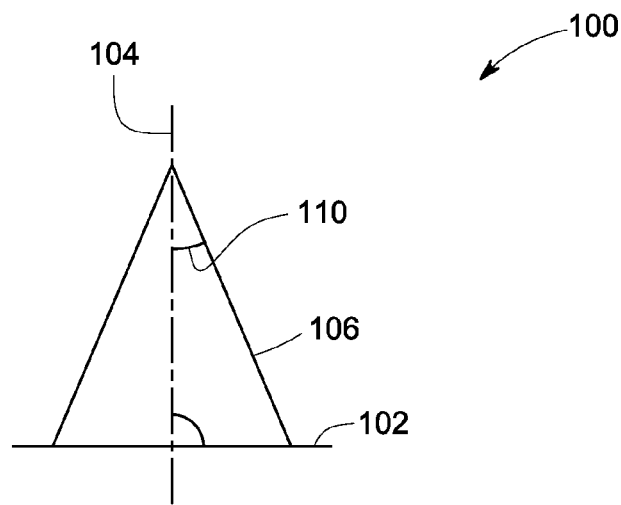
FIG. 1 is a schematic of an embodiment of the present invention.

As discussed in detail below, some of the embodiments of the present invention provide a coating for optical surfaces to improve energy conversion. These embodiments advantageously reduce loss of light due to reflection and thermalization mechanisms. The embodiments of the present invention also describe an improved optoelectronic device having such a coating disposed on a surface of the optoelectronic device.

Approximating language, as used herein throughout the specification and claims, may be applied to modify any quantitative representation that could permissibly vary without resulting in a change in the basic function to which it is related. Accordingly, a value modified by a term or terms, such as "about", is not limited to the precise value specified. In some instances, the approximating language may correspond to the precision of an instrument for measuring the value.

A "nanostructure" as used herein, is a structure having at least one region or characteristic dimension with a feature size of less than about 500 nanometers (nm), less than about 200 nm, less than about 100 nm, less than about 50 nm, or even less than about 20 nm. Examples of such structures include nanowires, nanorods, nanotubes, branched nanocrystals, nanotetrapods, tripods, bipods, nanocrystals, nanodots, nanoparticles and the like. Nanostructures can be substantially homogeneous in material properties. However, in other embodiments, the nanostructures can be heterogeneous. Nanostructures can be substantially crystalline (monocrystalline or polycrystalline), amorphous or a combination thereof. Other features of the nanostructure can have a size in the micrometer or even millimeter range. In one aspect, at least one dimension of the nanostructure has a size less than about 500 nm, for example, less than about 200 nm, less than about 100 nm, less than about 50 nm, or even less than about 20 nm.

The term "functional coating" as used herein refers to a coating or layer for optical surfaces for improving energy conversion.

The term "substantially transparent", according to the present invention, means that the nanostructures allow the passage of a substantial portion of solar radiation. The substantial portion may be at least about 70% of the solar radiation.

"Substantially perpendicular", according to the present invention, means that the primary axis is inclined at an angle in a range of from about 90 degrees to about 75 degrees to the surface of the substrate.

According to an embodiment of the present invention, an article having a nanostructured functional coating is provided. The coating is disposed on at least one surface of a substrate. The coating is characterized by both anti-reflecting and down-converting properties.

An "anti-reflection property", as defined herein, refers to a property of a coating, a layer or a surface, which reduces reflection of light from an optical surface. The anti-reflection property may depend on various parameters, such as the refractive index of the material, the thickness of the layer, or the structure of the layer or surface.

In general, the refractive index of a medium is defined as the ratio of the velocity of light in a vacuum to that of the medium. The refractive index of the nanostructures, according to the present invention, may refer to an "effective refractive index". The effective refractive index, as defined herein, is used to determine the phase lag and attenuation of the coherent wave as electromagnetic radiation propagates through the array of substantially transparent nanostructures. The optical nanostructures are a type of composite material having low refractive indices. These composite materials typically consist of various fractions of air and base material. The parameters such as size, local volume/area fraction, air/material fraction and material refractive index, determine the effective refractive index of the nanostructures. For example, a discussion of the effective refractive index of a suspension of sub-wavelength scattering particles is described in "Measurement of the Effective Refractive Index of a Turbid Colloidal Suspension Using Light Refraction," by A. Reyes-Coronado et al, New Journal of Physics 7 (2005) 89, which is incorporated herein by reference.

According to an embodiment of the present invention, the functional coating may include an anti-reflection layer. As used herein "an anti-reflection layer" may be a single layer, or more than one layer (multiple layers).

In one embodiment, the anti-reflection layer has a uniform refractive index. The reflectance of the anti-reflection array having a uniform refractive index may be minimum, for a particular wavelength at normal incidence. In alternative embodiments, the layer may have a graded refractive index. The gradient of refractive index can be achieved by compositional variations or structural variations.

The graded refractive index may be defined as a variation in the refractive index in a selected direction. The variation in refractive index may be continuous or gradual in the selected direction. An anti-reflection layer characterized by a graded index profile provides omnidirectional, broadband anti-reflection characteristics.

In certain embodiments, the anti-reflection layer may include an array of nanostructures. A nanostructure-containing layer usually has a lower refractive index than the refractive index of the dense materials, due to the nano-porous nature of the layer. The nanostructures may be substantially perpendicular, or tilted at an angle to the substrate. The nanostructures may be arranged in a random fashion or in a periodic fashion on the substrate.

The optical properties of nanostructures can be determined by their size, and chemical or surface compositions. Various properties of the nanostructures, such as absorption properties, emission properties and refractive index properties, can be utilized to create the anti-reflection layer that can be tailored and adjusted for various applications.

In one embodiment, the nanostructures may have a substantially uniform cross-sectional area along their height. The cross-sectional area may be in a variety of shapes. Examples of various shapes may include, but are not limited to, circular, triangular, rectangular, square, or hexagonal. Irregular shapes are also possible. In one embodiment, substantially all the nanostructures are nanowires. In another embodiment, substantially all of the nanostructures are nanorods.

The nanorods may have a height less than about 100 nm, in the above embodiment. In some embodiments, the nanorods may vary in height, in a range of from about 50 nm to about 100 nm. Furthermore, the nanorods may be arranged periodically on the surface of the substrate, with a period smaller than the wavelength of electromagnetic radiation. Such nanorods of substantially uniform cross-sectional area usually provide very low reflectance.

In above embodiment, the reflectivity of the anti-reflection layer is characterized by a sub-wavelength scattering phenomenon. The nanostructures having the substantially uniform cross-sectional areas may behave as sub-wavelength scattering objects, which provide large forward scattering, and subsequent transmission of light to the underlying substrate. This effect has been shown in absorbing silicon nanowire arrays. (However, in that case, strong absorption due to light trapping occurred, due to the use of absorbing nanowires, as described, for example, in "Strong Broadband Optical Absorption in Si Nanowire Films", by L. Tsakalakos et al, Journal of Nanophotonics, 17 Jul. 2007, vol. 1, which is incorporated herein by reference). When light interacts with such a sub-wavelength cylindrical object, the light "Mie scatters", following the Rayleigh criterion, such that the scattering cross-section is proportional to the fourth power of the size of the particle (for example in the case of a spherical particle). This phenomenon is described, for example, in "Absorption and Scattering of Light by Small Particles", by C. F. Bohren et al, Wiley-Interscience, N.Y. (1983), which is incorporated herein by reference.

In another embodiment, the array of nanostructures may have a graded refractive index. The graded refractive index results from a non-uniform cross-sectional area along a primary axis of the nanostructures, in some embodiments. In other words, the nanostructures may have a graded cross-sectional area along the primary axis. The primary axis is substantially perpendicular to the surface of the substrate. In this embodiment, the nanostructures of the present invention can have a variety of shapes. In one embodiment, substantially all of the nanostructures are pyramidal in shape. Alternatively, substantially all of the nanostructures are conical in shape.

The term "pyramidal" mentioned herewith generally refers to the geometrical definition of the term. A pyramid is a polyhedron formed by connecting a polygonal base and a point, called the apex. Each base edge and apex form a triangle. It can be thought of as a conical solid with a polygonal base. The polygonal base may take the shape of a triangle, a square, a pentagon, a hexagon, and the like. The pyramid may also have a star polygon base. The "conical shape" defined herein refers to a figure bounded by a planar base and a surface (lateral surface) formed by the locus of all straight-line segments joining the apex to the perimeter of the base. The axis of a cone is a straight line passing through the apex, about which the lateral surface has a rotational symmetry. The base may be circular or oval, and the apex may lie in any location. The cone may be a right circular cone or an oblique circular cone, for example.

As described above, the pyramidal or conical nanostructure usually has a continuously varying cross-sectional area along the primary axis. The volume fraction of the nanostructure changes with the change in the cross-sectional area. As the volume fraction changes, the ratio of air to material changes along the primary axis. As discussed above, this produces a variation in the effective refractive index along the primary axis of the nanostructure, and results in a graded effective refractive index nanostructure. Such an anti-reflection layer is described in a patent application (application Ser. No. 12/421101) entitled "Nanostructured Anti-reflection Coatings and Associated Methods and Devices" filed on Apr. 9, 2009, which is incorporated herein by reference.

The nanostructures may be relatively narrow or wide, depending on an internal angle of the pyramidal or conical shape. The internal angle as used herein may be defined with reference to FIG. 1. FIG. 1 shows a cross-sectional view 100 of a single pyramidal or conical nanostructure on a surface 102. The nanostructure has the primary axis 104, and 106 is a straight line joining the perimeter of the base to the apex. The internal angle is an angle 110 between the axis 104 and the straight line 106.

Each of the pyramidal or conical nanostructures may have a steep or gentle grading, depending on the internal angle. The gradient of the refractive index depends on the internal angle of the nanostructures. The internal angle of the pyramidal or conical nanostructures may be greater than about 1 degree. In one embodiment, the internal angle may be in a range from about 1 degree to about 20 degrees, from about 20 degrees to about 40 degrees, from about 40 degrees to about 60 degrees, or from about 60 degrees to about 70 degrees. In a particular embodiment, which is preferred for some end uses, the internal angle may be in a range of from about 20 degrees to about 40 degrees.

The functional coating may have a lower region and an upper region. The lower region is usually in contact with the substrate, and the upper region is substantially opposite the lower region. The refractive index of the coating may gradually vary from a value in the lower region to a value in the upper region. As the lower region is in contact with the substrate, the lower region usually has a value, which substantially matches the refractive index of the substrate. The type of variation of the refractive index towards the upper region may depend on the presence of a "medium" near the upper region, as discussed below. In some embodiments, the refractive index may increase or decrease in a direction extending from the lower region to the upper region, and may substantially match the refractive index of the medium near the upper region.

In one embodiment, the medium may be air (having a refractive index substantially equal to 1). Therefore, the refractive index of the coating may decrease from the lower region to the upper region in such a way as to attain a lower value at the upper region. In one particular embodiment, the lower value of the refractive index at the upper region may be about 1.

In some embodiments, the functional coating may include a plurality of anti-reflection layers. It should be noted that the plurality of layers is usually characterized by a graded refractive index. Multiple layers of varying refractive indices may be deposited, one over another, to attain the desired grading. In other words, the coating may include multiple arrays of nanostructures, to achieve a gradient refractive index from the substrate to an ambient medium. For example, a graded effective refractive index coating having $TiO_2$ and $SiO_2$ nanostructured layers, deposited by oblique angle deposition, can have a refractive index varying from 2.7 to 1.05, as described in "Optical Thin-Film Materials With Low Refractive Index For Broadband Elimination Of Fresnel Reflection", by J.-Q. Xi et al, Nature Photonics, Vol. 1, page 176, 2007, which is incorporated herein by reference. Also, the combination of nanostructured layers can be used to achieve any refractive index value between about 2.7 and about 1.05.

According to some embodiments of the present invention, the anti reflection layer includes a graded composition from the lower region to the upper region. The graded composition provides a graded refractive index to the coating. In other words, the refractive index changes because of the change in the composition of the material. The "graded composition" as defined herein refers to a gradual variation in the composition in one direction, although the gradation may not always be constant.

In the above embodiment, the coating may contain a single anti-reflection layer, as compared to embodiments, which contain multiple anti-reflection layers. In one embodiment, the graded composition may comprise a combination of at least two electrically conductive materials. The concentrations of the constituent materials change gradually to achieve the gradation. The gradation in the single layer may be achieved by depositing varying concentrations of constituents. In another embodiment, the graded composition may be achieved by depositing multiple materials, each having a selected composition different from that of at least one of the other materials. Alternately, gradation in the anti-reflection coating may be obtained by depositing multiple layers of different compositions.

The size (height and cross-sectional dimensions) and shape of the nanostructures may depend on the process used to grow such nanostructures, and on the temperature at which the nanostructures are grown. In one embodiment, substantially all of the nanostructures of the above-described anti-reflection layer may have a height in a range from about 100 nanometers to about 10 micrometers. In some preferred embodiments, each of the nanostructures may have height in a range from about 200 nanometers to about 2 micrometers. In one embodiment, each of the nanostructures may have a surface contact area in a range from about 100 $nm^2$ to about $10^4$ $nm^2$. The surface contact area is the cross-sectional area at the lower region of the nanostructure. In some embodiments, the nanostructures may vary in height and surface contact area, within the array.

According to an embodiment of the present invention, the anti-reflection layer includes a transparent, electrically conductive material. Some examples of suitable, transparent electrically conductive materials may include an oxide, sulfide, phosphide, telluride, or combinations thereof. These transparent electrically conductive materials may be doped or undoped. In an exemplary embodiment, the electrically conductive oxide may include titanium dioxide, silicon oxide, zinc oxide, tin oxide, aluminum doped zinc oxide, fluorine-doped tin oxide, cadmium stannate (tin oxide), and zinc stannate (tin oxide). In another embodiment, the electrically conductive oxide includes indium containing oxides. Some examples of suitable indium containing oxides are indium tin oxide (ITO), Ga—In—Sn—O, Zn—In—Sn—O, Ga—In—O, Zn—In—O, and combinations thereof. Suitable sulfides may include cadmium sulfide, indium sulfide and the like. Suitable phosphides may include indium phosphide, gallium phosphide, and the like. In one embodiment, the transparent electrically conductive material may have a bandgap greater than about 2.0 eV. In some embodiments, the anti-reflection layer may be compositionally graded, i.e., containing two or more transparent, electrically conductive materials with gradually varying concentrations.

In some embodiments, the anti-reflection layer may include a non-conductive, non-crystalline material such as glass. Non-limiting examples of glasses may include soda-lime glass, alumino-silicate glass, boro-silicate glass, silica, and iron-rich glass. In some embodiments, the array of substantially transparent nanostructures may include a non-conductive crystalline material.

According to an embodiment of the present invention, the substrate may have a substantially planar surface. A "substantially planar surface", as defined herein, usually refers to a substantially flat surface. The surface can be smooth, although it may include a relatively minor degree (e.g., about 20% of the total surface area) of texture (e.g., roughness), indentations, and various irregularities. In some embodiments, the substrate can exhibit flexibility. Moreover, in some embodiments, the surface of the substrate may be curved—usually with a relatively large radius of curvature.

Substrate selection may include substrates of any suitable material, including, but not limited to, metal, semiconductor, doped semiconductor, amorphous dielectrics, crystalline dielectrics, and combinations thereof. In some embodiments, the substrate includes a material which is transparent and electrically conductive, as described above.

According to an embodiment of the invention, the functional coating is characterized by down-converting properties. "Down-conversion" represents a method for the generation of multiple electron-hole pairs, per incident high-energy photon, and can be used to reduce the thermalisation losses. A down-converter/down-converting material transforms incident photons with energies exceeding n-times the band-gap energy of the device material into n lower energy photons, which can be used for the generation of "n" electron-hole pairs inside the device.

Figure 2:
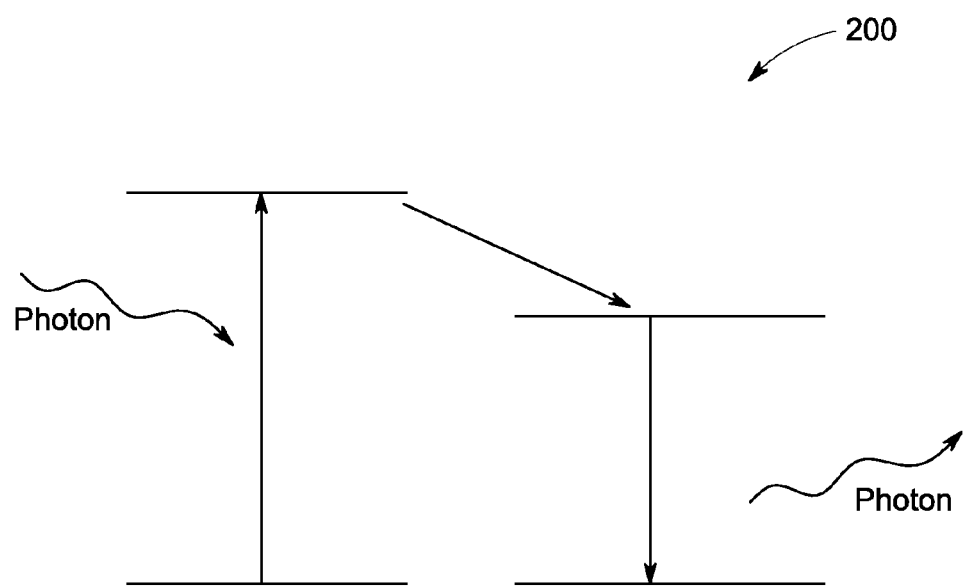
FIG. 2 is an energy level diagram for a material related to one embodiment of the present invention.

"Down-conversion" is a material property that can be achieved if the material contains states or bands of intermediate energies. Incident high-energy photons can be transformed by the material into one or multiple lower energy photons. A preferred embodiment is the emission of one photon per absorbed photon. FIG. 2 shows such energy levels of atoms in a down-converting material, and illustrates the process of down-conversion in which one photon of lower energy is produced.

According to an embodiment of the invention, the down-converting material comprises a host material and a dopant. A host material can be described as an optical absorbing host, which absorbs incoming radiation, such as an external photon. A dopant adds desired energy levels at which a generated internal photon is preferentially emitted, based on the underlying absorber properties. Therefore, a down-converting material, at the basic level, contains an absorber and an emitter.

A variety of dopants are used, based on the desired energy level of the emitted photon. In one embodiment, dopant ions that may be used for 1 to 1 down-conversion, include lanthanide ions, transition metal ions and rare-earth ions. Examples of suitable dopant ions are $Ce^{3+}$, $Eu^{2+}$, $Sm^{2+}$, $Cr^{3+}$, $Mn^{2+}$ and $Mn^{4+}$. In addition, sensitizers may further be doped into the host materials along with the dopants. Sensitizers are useful if the dopant ions cannot be excited, for example, because of forbidden transitions. The exciting energy is absorbed by the sensitizers and subsequently transferred to the dopant ions. For example, the transition metal ions may be sensitized by the lanthanide ions.

Although FIG. 2 shows the emission of one photon as a result of absorption of a higher energy photon, it is possible to produce multiple photons per absorbed photon. In some embodiments, more than one photon is emitted per absorbed photon. This type of down-conversion is usually referred to as "quantum-cutting" or "quantum-splitting". For example, a single dopant ion such as $Pr^{3+}$, $Tm^{3+}$ or $Gd^{3+}$, or a combination of two ions, such as the $Gd^{3+}$—$Eu^{3+}$ dual ion, may be able to generate two low energy photons for every incident high-energy photon. Other combinations include $Yb^{3+}$—$Tb^{3+}$ and $Yb^{3+}$—$Pr^{3+}$ dual ions.

In some embodiments, the down-converting material may include organic materials. For example, an organic down-converting material may include an organic dye, such as BASF lumogen dye. Furthermore, other down-converting materials may include a hybrid organic-inorganic dye.

According to an embodiment of the present invention, the down-converting material may be present in form of nanostructures. As discussed above, the nanostructures can be in a variety of shapes and sizes. The down-converting materials may also contain additional layers on them, for the purposes of surface passivation (e.g. a core-shell structure), or to facilitate incorporation into the functional coating (e.g. a silica or organic monolayer shell).

The optical properties of nanostructures can be determined, in large part, by their size and chemical or surface composition. By controlling the size and composition of the nanostructures used in the present invention, the nanostructures of down-converting material may absorb radiation of a particular wavelength, or a particular range of wavelengths, while not scattering. The nanostructures may absorb radiation from UV, to visible, to near infrared, to infrared. In a preferred embodiment for solar energy conversion, the nanostructures absorb radiation below about 550 nm, and emit radiation longer than 550 nm. The nanostructures for use in the present invention may suitably be less than about 500 nm in size. In some specific embodiments, the size of the nanostructures may be in a range of from about 10 nm to about 100 nm.

Figure 3:
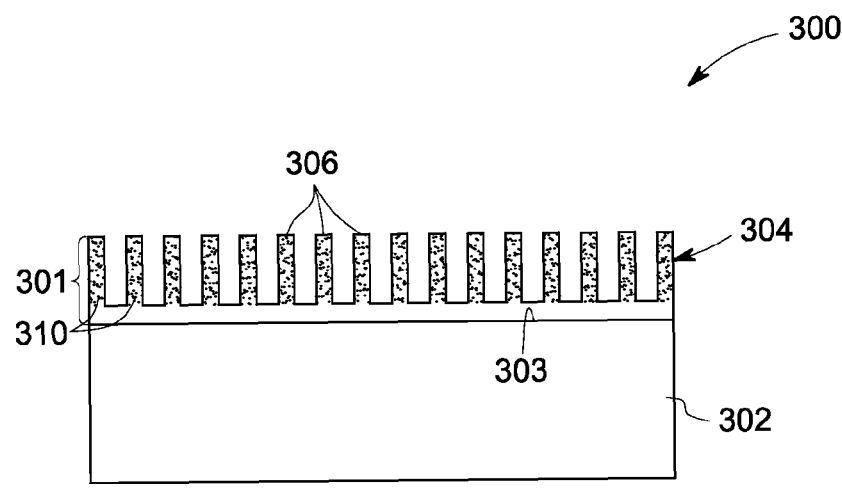
FIG. 3 is a schematic of another embodiment of the present invention.

According to an embodiment of the present invention, the nanostructures of the down-converting material may be embedded in the anti-reflection layer. As used herein, the term "embedded" is used to indicate that the down-converting nanostructures are at least substantially enclosed within the anti-reflection nanostructures. Such an embodiment is represented in FIG. 3, which shows a cross-sectional view of an article 300, having an anti-reflection layer 301 disposed on a surface 303 of a substrate 302. The anti-reflection layer 301 includes an array 304 of nanostructures 306. Down-converting nanostructures 310 (i.e., nanostructures formed of the down-converting material) are embedded within substantially all of the nanostructures 306 of the array 304.

Figure 4:
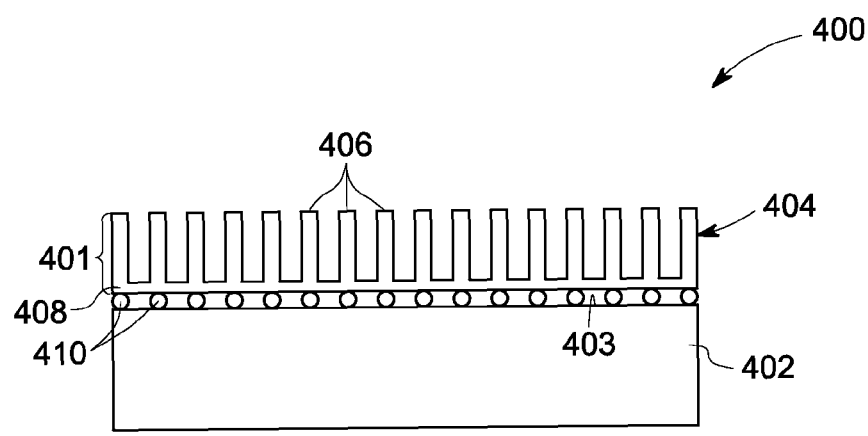
FIG. 4 is a schematic of an embodiment of the present invention.

In another embodiment, the down-converting nanostructures may be disposed below the anti-reflection layer. FIG. 4 shows a cross-sectional view of an article 400. An anti-reflection layer 401 is disposed on a surface 403 of a substrate 402. The anti-reflection layer includes an array 404 of anti-reflection nanostructures 406, having a lower region 408. Down-converting nanostructures 410 (i.e., nanostructures of the down-converting material) are in substantial contact with the lower region 408 of the anti-reflection nanostructures 406, and the surface 403 of the substrate.

Figure 5:
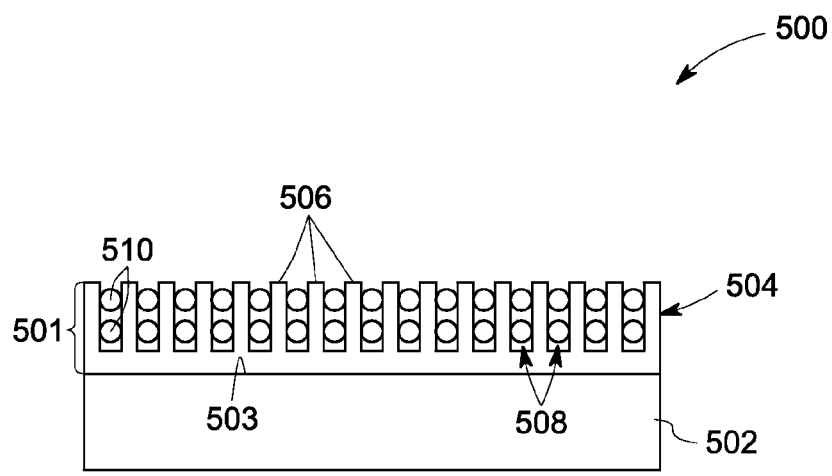
FIG. 5 is a schematic of another embodiment of the present invention.

FIG. 5 illustrates the cross-sectional view of an article 500 for another embodiment of the present invention. The anti-reflection layer 501 is disposed on a surface 503 of a substrate 502. The anti-reflection layer has an array 504 of nanostructures 506. The nanostructures 506 are spaced from each other, and form voids 508 between the nanostructures 506. Down-converting nanostructures 510 (i.e., nanostructures of the down-converting material) are located in substantially all of the voids 508 of the anti-reflection array 504.

In some embodiments of the present invention, the down-converting material may be present in the functional coating in any amount (percentage) that is appropriate for the desired function. Suitably, the down-converting material may be present in the functional coating at a level of between about 0.001% to about 80% by volume, depending on the application, type of anti-reflection coating and type of down-converting material. In some preferred embodiments, the percentage (amount) may be in a range of from about 20% to about 50%. In the above embodiments, the down-converting nanostructures are, typically, uniformly distributed within the functional coating. Alternately, the nanostructures can be randomly distributed. In certain embodiments, the nanostructures form a density gradient from a lower region to an upper region within the functional coating.

Figure 6:
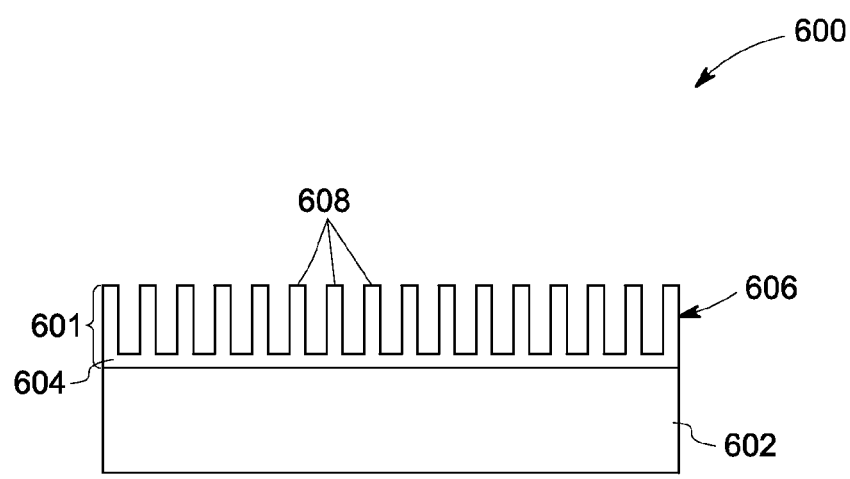
FIG. 6 is a schematic of one embodiment of the present invention.

In another embodiment of the present invention, the functional coating includes a layer of down-converting material, as compared to previously described embodiments, where the functional coating included an anti-reflection layer. In this embodiment, the down-converting material is present in crystalline form. The down-converting material may be a single crystal, polycrystalline or multi-crystalline. FIG. 6 illustrates an article 600 including a functional coating 601, having a layer 604 of down-converting material, disposed on a surface of a substrate 602, in this embodiment of the invention. The down-converting layer 604 is provided with anti-reflection properties by way of an array 606 of nanostructures 608. The array 606 of nanostructures 608 contributes to low reflectance. The array 606 of nanostructures 608 (which constitute the down-converting "layer") is formed of the down-converting materials, which are described above.

In one embodiment, the nanostructures 608 usually have a uniform cross-sectional area along a primary axis. The primary axis is substantially perpendicular to the surface of the substrate. The dimensions (height and diameter) of the nanostructures are selected to achieve low reflectance through sub-wavelength scattering phenomenon in the down-converting layer. In another embodiment, the nanostructures 608 of the array 606 have a non-uniform cross-sectional area along the primary axis of the nanostructures. In other words, the nanostructures may have a graded cross-sectional area along the primary axis, which results in a graded refractive index of the functional coating. In this embodiment, the nanostructures of the present invention can have a variety of shapes. In one embodiment, substantially all of the nanostructures are pyramidal in shape. Alternatively, substantially all of the nanostructures are conical in shape.

Another embodiment of the present invention is directed to an optoelectronic device. The device includes a substrate and a multi layer structure disposed on the substrate. The device further includes a nanostructured functional coating disposed on an electromagnetic radiation-receiving side of the device. The functional coating is characterized by both anti-reflection and down-converting properties. The multi layer structure of the device may be selected from the group consisting of a PN-junction, a hetero-junction, a quantum well, and a superlattice. In one embodiment, the functional coating is disposed on either side of the substrate. In another embodiment, the functional coating is disposed on a light-receiving surface of the multi layer structure.

As used herein, the "optoelectronic device", refers to devices that either produce light, or use light in their operation. Optoelectronic devices are electrical-to-optical or optical-to-electrical devices, or instruments that use such devices in their operation. Typically, a semiconducting junction is an integral part of optoelectronic devices. The semiconducting junction may be a p-n junction, an n-p junction, a p-i-n junction, or an n-i-p junction. For example, as those skilled in the art understand, the p-n junction is capable of generating electrical energy in the presence of sunlight, which is the basis for the general operation of photovoltaic devices or solar cells. The device further includes a conductive pathway to direct the generated electrical energy to an external circuit.

Furthermore, the optoelectronic devices may be of several types. In some embodiments, the optoelectronic device may be a photodiode, a light emitting diode, a photovoltaic device, or a semiconductor laser. These optoelectronic devices can be used in variety of applications. Examples of applications include an electronic display, a photo detector, general lighting, a camera, and fiber-optic communication.

In a preferred embodiment, the optoelectronic device is a photovoltaic cell or a photovoltaic module. The photovoltaic module may have an array of the photovoltaic cells. The photovoltaic module may have a glass cover protecting the cells onto which the functional coating is disposed. The functional coating can be disposed on the photovoltaic cells, or on the photovoltaic module, such that the functional coating is exposed to the solar radiation. In some embodiments, the functional coating is disposed on the backside of the module glass cover. The coating can be disposed on more than one location of the photovoltaic module. For example, the coating can be disposed on a topside of the module glass cover, a backside of the module glass cover, and/or on a surface of the solar cells in the module, such that the coating is exposed to the solar radiation.

In some embodiments, the photovoltaic module or the photovoltaic cell may include, but is not limited to, an amorphous silicon cell, a crystalline silicon cell, a hybrid/heterojunction amorphous and crystalline silicon cell, a CdTe thin film cell, a micromorph tandem silicon thin film cell, a $Cu(In,Ga)Se_2$ (CIGS) thin film cell, a GaAs cell, a multiple-junction III-V-based solar cell, a dye-sensitized solar cell, or a solid-state organic/polymer solar cell. In some embodiments, the solar cell may contain a transparent conductor onto which the functional anti-reflecting coating is disposed.

The nanostructured functional coatings can be formed (deposited) by variety of techniques, such as wet etching, dry etching, physical vapor deposition, sputtering, solution growth, and solution deposition. Examples of suitable dry etching techniques include, but are not limited to, reactive ion etching (RIE), inductively coupled plasma (ICP) etching, and combinations thereof. The dry etching technique may be combined with a method of forming nanoscale etch masks. Nanoscale etch masks may be formed by nanosphere lithography, dip-coating, spray-coating, spin-coating, sputtering, in-situ nanoparticle deposition, and combinations thereof. An example of a suitable wet etching technique is metal-assisted wet etching.

In an exemplary embodiment, the deposition technique is selected from the group consisting of chemical vapor deposition, wet chemical solution deposition, physical vapor deposition, and glancing angle deposition. Glancing angle deposition is known in the art, and described, for example, in "Designing Nanostructures by Glancing Angle Deposition" by Y. P. Zhao et al, Proceedings of SIPE Vol. 5219 Nanotubes and Nanowires; SPIE, Bellingham, Wash., 2003. In brief, the glancing angle deposition (GLAD) technique is usually carried-out by combining oblique angle deposition with substrate positional control. GLAD involves a physical vapor deposition process where the deposition flux is incident onto a substrate with a large angle with respect to the surface normal, while the substrate is rotating. GLAD produces columnar structures through the effect of shadowing during film growth, while the substrate rotation controls the shape of the columns. GLAD provides three parameters—the incident angle, the growth rate and the substrate rotational speed, to control the morphology of the nanostructures. During GLAD, the deposition rate not only has a vertical component (with respect to the substrate), but also has a lateral component. The lateral growth rate contributes to the shadowing effect, which gives rise to two major advantages for GLAD: the self-alignment effect and the lateral sculpturing effect.

EXAMPLES

The following examples are presented to further illustrate certain embodiments of the present invention. These examples should not be read to limit the invention in any way.

Example 1

In one example, nanosphere lithography was combined with reactive ion etching (RIE) to form nanostructured antireflective layers on a glass substrate. Nanosphere lithography is well known and described, for example, in "Nanosphere Lithography: A Materials General Fabrication Process For Periodic Particle Array Surfaces", J. C. Hulteen et al, *J. Vac. Sci. Technol.* A, 13 1553 (1995). A fused silica substrate was coated with a 1 micrometer thick amorphous silica layer by high temperature low-pressure chemical vapor deposition (and in some cases, by other methods). After a standard cleaning procedure, nanosphere lithography was performed by dipping the substrates in a solution containing polystyrene nanospheres, such that the nanospheres assembled into a hexagonal close-packed monolayer lattice on the glass surface, when removed from the solution. A 100 nm Ni film was then electron-beam evaporated onto the samples, such that Ni nanoscale dots/triangles were formed on the glass substrates in the location below the interstices of the nanospheres. The nanospheres were removed from the surface by soaking in acetone to allow for lift-off. Nanostructure arrays were formed by placing the samples in an RIE reactor, using a standard oxide etch recipe, targeting a 2 micron etch depth. Higher power in the RIE reactor led to more etching of Ni with respect to the glass substrate, which led to conical nanostructures. By controlling the relative etch rates of the glass substrate to that of the Ni nanoscale dots/triangles, narrow or wide conical nanostructures were created. Finally, the Ni was etched, using a standard etchant for this metal with a 100% over-etch. Down converting nanoparticles are then placed on the surface of cylindrical or conical nanostructures array by dip coating, spray coating, or spin coating.

Example 2

Silicon oxide film containing down-converting particles is deposited from a spin-on glass solution onto a glass substrate, or is deposited on a solar cell. Down-converting nanoparticles are incorporated within the film by mixing with the spin-on glass precursor solution. The composite film is thermally annealed to solidify the silicon oxide phase. Nanosphere lithography is performed by dipping the substrate in a solution containing polystyrene nanospheres, such that the nanospheres assemble into a hexagonal close-packed monolayer lattice on the glass surface, when removed from the solution. A 100 nm Ni film is then electron-beam evaporated onto the samples, such that Ni nanoscale dots/triangles are formed on the glass substrates in the location below the interstices of the nanospheres. The nanospheres are removed from the surface by soaking in acetone to allow for lift-off. A nanostructure array is formed by placing the samples in an RIE reactor, using a standard oxide etch recipe, targeting a 2 micron etch depth. By controlling the relative etch rates of the glass substrate to that of the Ni nanoscale dots/triangles, narrow or wide conical nanostructures are created.

Example 3

A single crystal of down-converting material is formed by standard crystal growth methods. The crystal is then thinned to the desired level and etched by the approach described above, to form an array of nanostructures.

Example 4

A down converting material is directly grown from the vapor phase in the form of nanostructures by using CVD, MOCVD, and related methods, or from solution phase using catalyzed solution decomposition and growth methods known in the art.

The nanostructured functional coating can be integrated with a PV module using an index matching adhesive layer, such as EVA (ethylene vinyl alcohol).

While only certain features of the invention have been illustrated and described herein, many modifications and changes will occur to those skilled in the art. It is, therefore, to be understood that the appended claims are intended to cover all such modifications and changes as fall within the true spirit of the invention

The invention claimed is:
1. An article, comprising:
a substrate;
a multi-layer structure disposed on a surface of the substrate; and
a nanostructured functional coating disposed on an electromagnetic radiation-receiving surface of the substrate, wherein the electromagnetic radiation-receiving surface is opposite to the surface on which the multi-layer structure is disposed, wherein the nanostructured functional coating is characterized by both anti-reflection properties and down-converting properties, wherein the nanostructured functional coating comprises an anti-reflection layer, wherein the anti-reflection layer comprises an array of nanostructures, wherein the nanostructured functional coating comprises a down-converting material present in the form of nanostructures selected from nanowires and nanorods extending substantially perpendicular to the surface of the substrate;
wherein the article is a photovoltaic device.
2. The article of claim 1, wherein the anti-reflection layer has a uniform refractive index.
3. The article of claim 1, wherein the anti-reflection layer has a graded refractive index in a direction substantially perpendicular to the substrate.
4. The article of claim 1, wherein the anti-reflection layer comprises a lower region in contact with the substrate, and an upper region substantially opposite the lower region, and the refractive index of the array varies from a value, in the lower region, that substantially matches the refractive index of the substrate, to a higher value or a lower value, in a direction extending from the lower region to the upper region.
5. The article of claim 1, wherein the anti-reflection layer comprises a transparent conductive material.

6. The article of claim 5, wherein the transparent conductive material comprises a transparent conductive oxide, sulfide, phosphide, telluride, arsenide, nitride, or combination thereof.

7. The article of claim 1, wherein the anti-reflection layer comprises a transparent non-conductive crystalline material.

8. The article of claim 1, wherein the anti-reflection layer comprises a transparent non-conductive non-crystalline material.

9. The article of claim 1, wherein the down-converting material comprises a host and a dopant.

10. The article of claim 9, wherein the host comprises a material selected from the group consisting of oxides, sulfides, borates, phosphates, silicates, flourides and oxyflourides, nitrides and oxynitrides, halides or combinations thereof.

11. The article of claim 9, wherein the dopant comprises a rare-earth ion, a transition metal ion, or a lanthanide ion.

12. The article of claim 1, wherein the size of the nanostructures is in a range of from about 1 nanometer to about 500 nanometers.

13. The article of claim 12, wherein the size of the nanostructures is in a range of from about 10 nanometers to about 100 nanometers.

14. The article of claim 1, wherein the nanostructured functional coating comprises an anti-reflection layer; and the nanostructures are embedded within the anti-reflection layer.

15. The article of claim 1, wherein the nanostructured functional coating comprises an anti-reflection layer; and the nanostructures are disposed below the anti-reflection layer.

16. The article of claim 1, wherein the nanostructures in the anti-reflection layer are spaced from each other to form voids in the array of nanostructures, and down-converting nanostructures are located in substantially all of the voids of the array of nano structures.

17. The article of claim 1, wherein the down-converting material is present in crystalline form.

18. The article of claim 17, wherein the down-converting material comprises an array of nanostructures, each nanostructure having a substantially uniform cross-sectional area.

19. The article of claim 17, wherein the down-converting material comprises an array of nanostructures, each nanostructure having a graded cross-sectional area.

20. An optoelectronic device, comprising:
a substrate;
a multi-layer structure disposed on a surface of the substrate; and
a nanostructured functional coating disposed on an electromagnetic radiation-receiving surface of the substrate wherein the electromagnetic radiation-receiving surface is opposite to the surface on which the multi-layer structure is disposed, wherein the nanostructured functional coating is characterized by both anti-reflection properties and down-converting properties, wherein the nanostructured functional coating comprises an anti-reflection layer, wherein the anti-reflection layer comprises an array of nanostructures, wherein the nanostructured functional coating comprises a down-converting material present in the form of nanostructures selected from nanowires and nanorods extending substantially perpendicular to the surface of the substrate;
wherein the optoelectronic device is a photovoltaic device.

21. The optoelectronic device of claim 20, wherein the multi-layer structure comprises one selected from the group consisting of a PN-junction, a hetero-junction, a quantum well, and a superlattice.

22. An article, comprising:
a substrate;
a multi-layer structure disposed on a surface of the substrate; and
A nanostructured functional coating disposed on an electromagnetic radiation receiving surface of the substrate, wherein the electromagnetic radiation receiving surface is opposite to the surface on which the multi-layer structure is disposed, the nanostructured functional coating comprising an anti-reflection layer characterized by both anti-reflection properties and down-converting properties, the anti-reflection layer comprising an array of nanostructures comprising a down-converting material, wherein substantially all of the nanostructures extend substantially perpendicular to the surface of the substrate;
wherein the article is a photovoltaic device.

23. The article of claim 22, wherein substantially all of the nanostructures are selected from nanowires and nanorods, such that substantially all of the nanostructures have a substantially uniform cross-sectional area.

24. The article of claim 22, wherein substantially all of the nanostructures have a non-uniform cross-sectional area such that substantially all of the nanostructures are one of pyramidal and conical in shape.

25. The article of claim 24, wherein substantially all of the nanostructures of pyramidal and conical shape include an internal angle between about 20 degrees and about 40 degrees.

26. The article of claim 22, wherein the array of nanostructures is arranged periodically on the surface of the substrate with a period smaller than a wavelength of electromagnetic radiation received on the radiation receiving surface of the substrate.

* * * * *